United States Patent
Lee et al.

(10) Patent No.: US 12,347,781 B2
(45) Date of Patent: Jul. 1, 2025

(54) SEMICONDUCTOR DEVICES HAVING PENETRATION VIAS

(71) Applicant: Samsung Electronics Co., Ltd., Suwon-si (KR)

(72) Inventors: Hakseung Lee, Seoul (KR); Jinnam Kim, Anyang-si (KR); Hyoukyung Cho, Seoul (KR); Taeseong Kim, Suwon-si (KR); Kwangjin Moon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/137,506

(22) Filed: Apr. 21, 2023

(65) Prior Publication Data

US 2023/0260916 A1    Aug. 17, 2023

Related U.S. Application Data

(63) Continuation of application No. 16/849,085, filed on Apr. 15, 2020, now Pat. No. 11,664,316.

(30) Foreign Application Priority Data

Aug. 7, 2019    (KR) .......................... 10-2019-0096018

(51) Int. Cl.
*H01L 23/538*    (2006.01)

(52) U.S. Cl.
CPC ...... *H01L 23/5384* (2013.01); *H01L 23/5385* (2013.01); *H01L 2224/08146* (2013.01)

(58) Field of Classification Search
CPC ........... H01L 23/5384; H01L 21/76898; H01L 23/481; H01L 25/043; H01L 25/0657; H01L 25/074; H01L 25/0756; H01L 25/117; H01L 2224/05001–05091; B81B 7/0006; B81B 7/007; B81B 2207/07; B81B 2207/092; B81B 2207/097

See application file for complete search history.

(56) References Cited

U.S. PATENT DOCUMENTS 7,629,255 B2    12/2009    Fu et al.
7,803,714 B2    9/2010    Ramiah et al.
(Continued)

FOREIGN PATENT DOCUMENTS

JP    2010287859 A    12/2010
JP    5423020 B2    12/2013

*Primary Examiner* — Laura M Menz
*Assistant Examiner* — Candice Chan
(74) *Attorney, Agent, or Firm* — Myers Bigel, P.A.

(57) ABSTRACT

A semiconductor device may include a first semiconductor substrate having a first surface and a second surface opposite from each other, a first circuit layer provided on the first surface of the first semiconductor substrate, a connection pad provided on the second surface of the first semiconductor substrate, and a first penetration via and a second penetration via extending from the second surface of the first semiconductor substrate and into at least a portion of the first circuit layer. The first penetration via and the second penetration via may be provided in a first penetration hole and a second penetration hole, respectively. Each of the first and second penetration holes may include a first portion, a second portion, and a third portion. A width of the first portion of the first penetration hole may be smaller than a width of the first portion of the second penetration hole.

19 Claims, 17 Drawing Sheets

(56) References Cited

U.S. PATENT DOCUMENTS

| | | |
|---|---|---|
| 8,384,225 B2 | 2/2013 | Rahman et al. |
| 8,415,804 B2 | 4/2013 | Lee et al. |
| 8,518,282 B2 | 8/2013 | Lee et al. |
| 8,729,711 B2 | 5/2014 | Nishio |
| 9,991,244 B2 | 6/2018 | Lin |
| 10,153,252 B2 | 12/2018 | Lin |
| 2013/0313718 A1 | 11/2013 | Varghese et al. |
| 2014/0015146 A1* | 1/2014 | Yu .................... H01L 23/481 257/774 |
| 2018/0286910 A1 | 10/2018 | Masahiro |
| 2021/0020544 A1 | 1/2021 | Park et al. |

\* cited by examiner

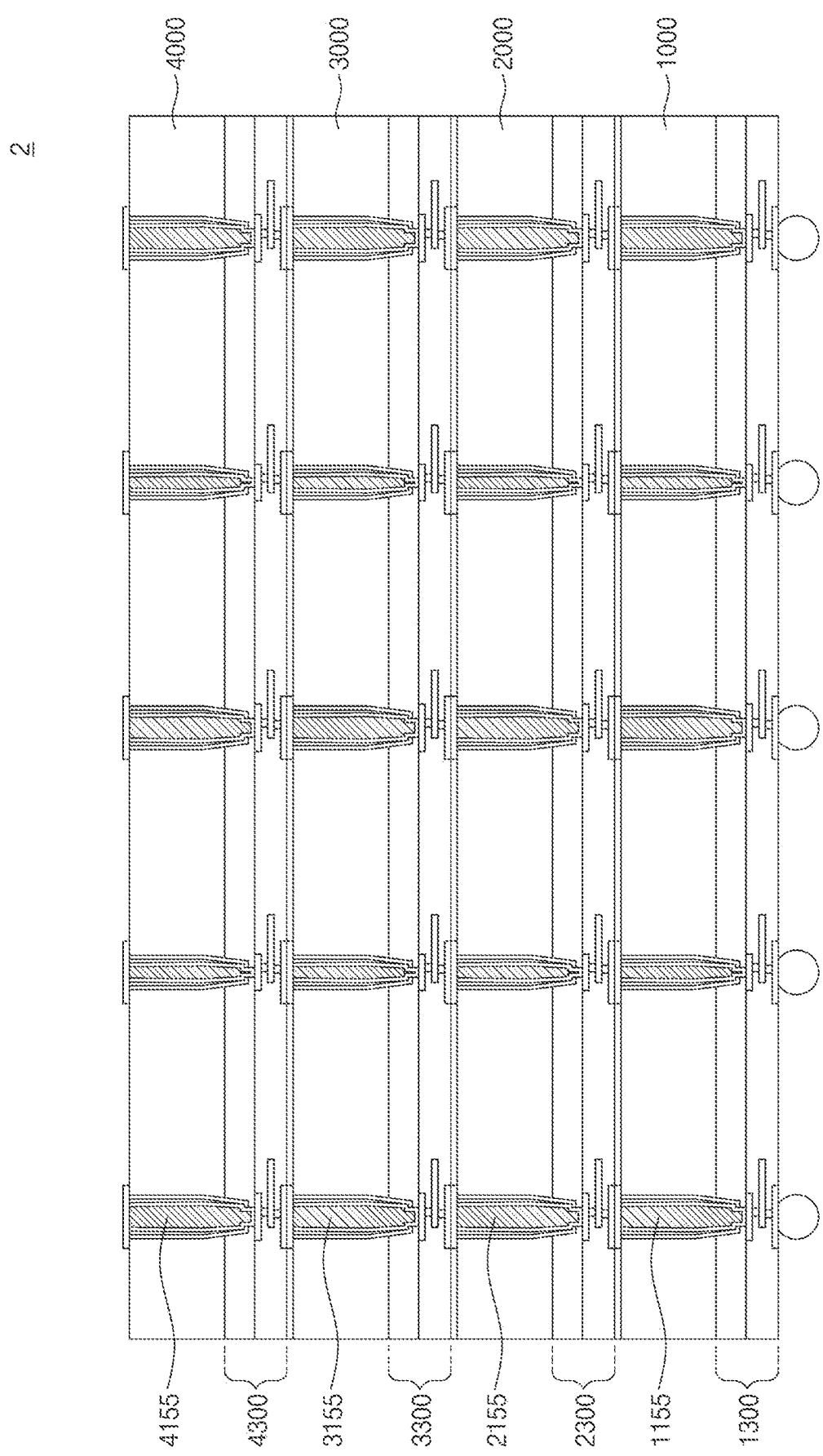

SEMICONDUCTOR DEVICES HAVING PENETRATION VIAS

CROSS-REFERENCE TO RELATED APPLICATION

The present application is a continuation of, and claims priority under 35 U.S.C. § 120 to, U.S. patent application Ser. No. 16/849,085, filed Apr. 15, 2020, which, in turn, claims priority under 35 U.S.C. § 119 to Korean Patent Application No. 10-2019-0096018, filed on Aug. 7, 2019, in the Korean Intellectual Property Office, and the entire contents of each of the above-identified applications are hereby incorporated by reference.

TECHNICAL FIELD

The present disclosure relates to a semiconductor device, and in particular, to a semiconductor device with a penetration via.

BACKGROUND

A semiconductor device may be electrically connected to another semiconductor device or a printed circuit board through a penetration via. The penetration via may be used to realize a three-dimensional package structure and may result in a increased transmission speed as compared with structures with solder balls or solder bumps. As an integration density of semiconductor devices increases, there may be an increasing demand for penetration vias with high mechanical and electrical reliability characteristics.

SUMMARY

Aspects of the present disclosure provides a semiconductor device with improved reliability and a method of fabricating the same.

According to some embodiments of the inventive concepts, a semiconductor device may include a first semiconductor substrate having a first surface and a second surface opposite to each other, a first circuit layer provided on the first surface of the first semiconductor substrate, a connection pad provided on the second surface of the first semiconductor substrate, and a first penetration via and a second penetration via penetrating the first semiconductor substrate and at least a portion of the first circuit layer. The first penetration via and the second penetration via may be provided in a first penetration hole and a second penetration hole, respectively. Each of the first and second penetration holes may include a first portion, a second portion, and a third portion. The first portions of the first and second penetration holes may be adjacent to the second surface of the first semiconductor substrate. A width of the first portion of the first penetration hole may be smaller than a width of the first portion of the second penetration hole.

According to some embodiments of the inventive concepts, a semiconductor device may include a first semiconductor substrate having a first surface and a second surface opposite from each other; a second semiconductor substrate having a first surface and a second surface opposite from each other; a first circuit layer provided on the first surface of the first semiconductor substrate; a second circuit layer provided on the first surface of the second semiconductor substrate; a connection pad interposed between the second circuit layer and the first semiconductor substrate; a first penetration via and a second penetration via extending from the second surface of the first semiconductor substrate into at least a portion of the first circuit layer; and a third penetration via penetrating the second circuit layer and at least a portion of the second circuit layer. A maximum width of the first penetration via is greater than a maximum width of the second penetration via.

According to some embodiments of the inventive concepts, a semiconductor device may include a first semiconductor substrate, a first circuit layer provided on a bottom surface of the first semiconductor substrate, a second semiconductor substrate provided on a top surface of the first semiconductor substrate, a second circuit layer interposed between the second semiconductor substrate and the first semiconductor substrate, first penetration vias penetrating the first semiconductor substrate and at least a portion of the first circuit layer, second penetration vias penetrating the second semiconductor substrate and at least a portion of the second circuit layer, and first connection pads provided on top surfaces of the first penetration vias. The first penetration vias may be electrically connected to the first connection pads, respectively. The second circuit layer may include second connection pads therein. The second penetration vias may be electrically connected to the second connection pads, respectively. The first connection pads may be directly coupled to the second connection pads, respectively. The first penetration vias may have at least two different widths, and the second penetration vias may have at least two different widths.

BRIEF DESCRIPTION OF THE DRAWINGS

Some example embodiments will be more clearly understood from the following brief description taken in conjunction with the accompanying drawings. The accompanying drawings represent non-limiting, example embodiments as described herein.

FIG. 5 is a sectional view illustrating a semiconductor device, according to some embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or

DETAILED DESCRIPTION

Some example embodiments of the inventive concepts will now be described more fully with reference to the accompanying drawings, in which example embodiments are shown.

Figure 1:
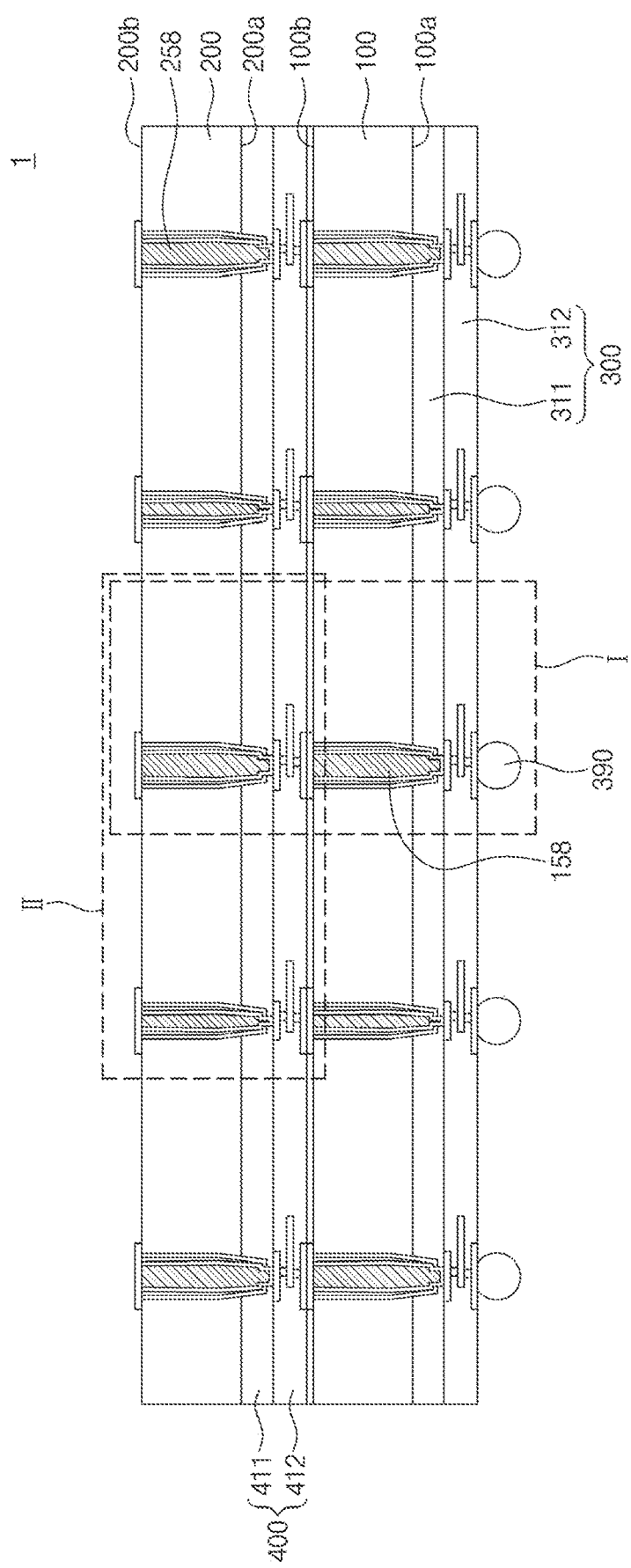
FIG. 1 is a sectional view illustrating a semiconductor device according to some embodiments of the inventive concepts.

FIG. 1 is a sectional view illustrating a semiconductor device according to some embodiments of the inventive concepts.

Referring to FIG. 1, a semiconductor device 1 may include a first semiconductor substrate 100, a first circuit layer 300, a first penetration via 158, a second semiconductor substrate 200, a second circuit layer 400, and a second penetration via 258. The semiconductor device 1 may be a memory chip, a logic chip, or a semiconductor chip including at least one memory chip and/or at least one logic chip. The first semiconductor substrate 100 may be a wafer- or chip-level substrate. The first semiconductor substrate 100 may be formed of or include at least one of silicon, germanium, or silicon-germanium. The first semiconductor substrate 100 may have a first surface 100*a* and a second surface 100*b* that are opposite to each other. In some embodiments, the second surface 100*b* of the first semiconductor substrate 100 may be parallel to the first surface 100*a*, but the present disclosure is not limited to this example. The first circuit layer 300 may be provided on the first surface 100*a* of the first semiconductor substrate 100. The first circuit layer 300 may include a first insulating layer 311 and a second insulating layer 312.

The first penetration via 158 may be formed in the first semiconductor substrate 100 and may penetrate at least a portion of the first circuit layer 300. For example, the first penetration via 158 may be provided to penetrate the first semiconductor substrate 100 and the first insulating layer 311. A connection terminal 390 may be provided on a bottom surface of the first circuit layer 300. The connection terminal 390 may include a solder ball. The connection terminal 390 may be formed of or include at least one of conductive materials (e.g., metals). The connection terminal 390 may be electrically connected to the first penetration via 158.

The second semiconductor substrate 200 may be a wafer- or chip-level substrate. The second semiconductor substrate 200 may be formed of or include at least one of silicon, germanium, or silicon-germanium. The second semiconductor substrate 200 may have a first surface 200*a* and a second surface 200*b* that are opposite to each other. In some embodiments, the second surface 200*b* of the second semiconductor substrate 200 may be parallel to the first surface 200*a*, but the present disclosure is not limited to this example. The second circuit layer 400 may be provided on the first surface 200*a* of the second semiconductor substrate 200. The second circuit layer 400 may include a third insulating layer 411 and a fourth insulating layer 412.

The second penetration via 258 may be formed in the second semiconductor substrate 200 and may penetrate at least a portion of the second circuit layer 400. For example, the second penetration via 258 may be provided to penetrate the second semiconductor substrate 200 and the third insulating layer 411.

In the present specification, the expression "electrically connected or coupled" may mean that a plurality of elements are directly connected/coupled to each other or are indirectly connected or coupled to each other via another conductive element. The first penetration via 158 and the connection terminal 390 may be used to send or receive electrical signals to or from the semiconductor device 1. The second penetration via 258 may be used to send or receive electrical signals to or from the first penetration via 158. Hereinafter, the first penetration via 158, the second penetration via 258, and a method of forming them will be described in more detail below.

FIGS. 2A to 2I are enlarged sectional views of a portion 'I' of FIG. 1 illustrating a method of fabricating a semiconductor device, according to an embodiment of the inventive concept. FIG. 3 is an enlarged sectional view illustrating a portion 'A' of FIG. 2D. For concise description, a previously described element may be identified by the same reference number without repeating an overlapping description thereof.

Figure 2A:
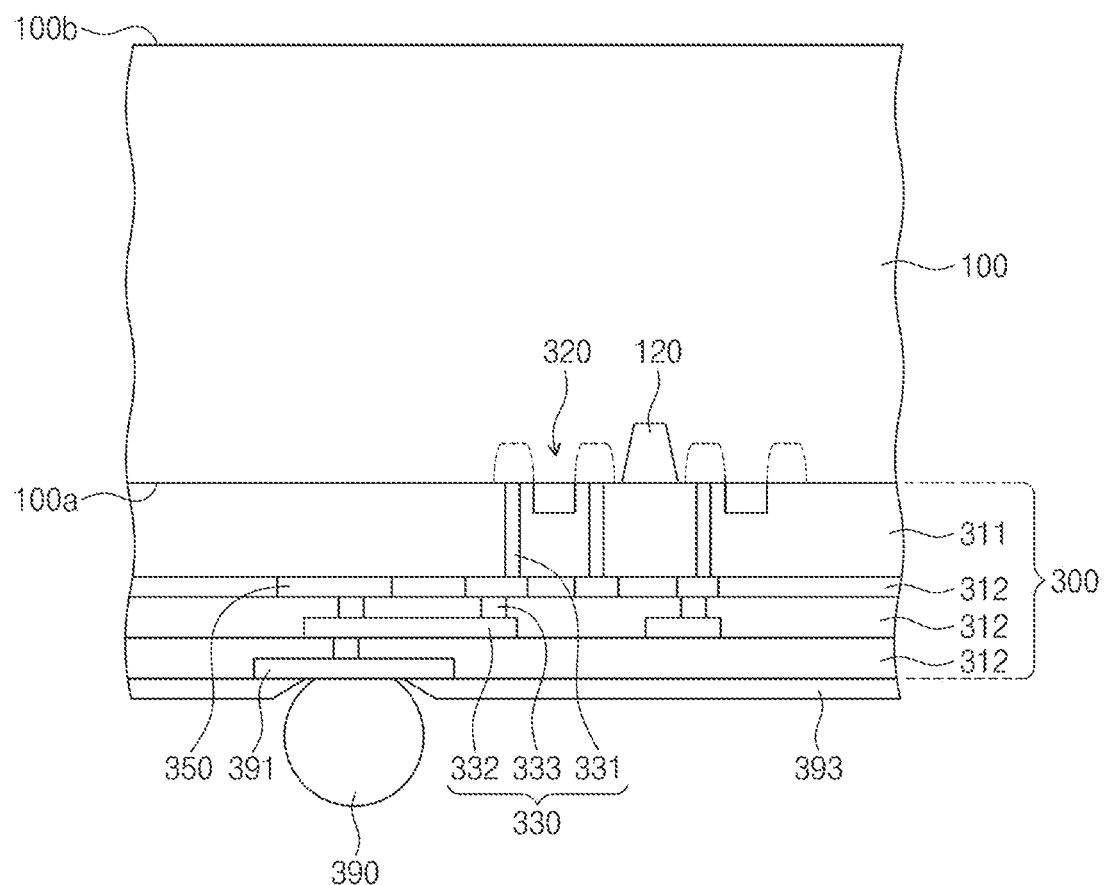
FIGS. 2A to 2I are enlarged sectional views of a portion 'I' of FIG. 1 illustrating a method of fabricating a semiconductor device, according to some embodiments of the inventive concepts.
Figure 3:
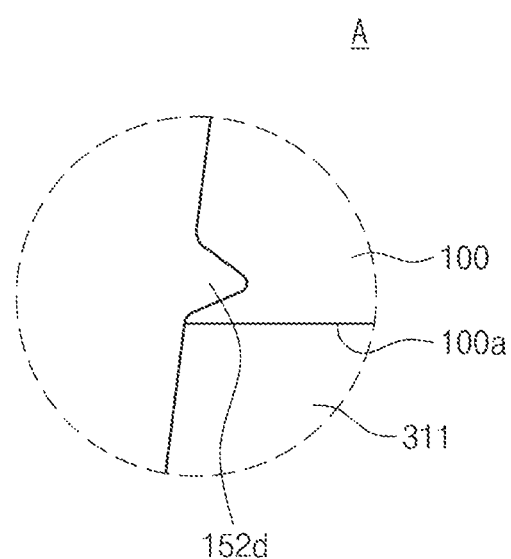
FIG. 3 is an enlarged sectional view illustrating a portion 'A' of FIG. 2D.

Referring to FIG. 2A, the first semiconductor substrate 100 may be provided. A device isolation pattern 120 may be disposed in the first semiconductor substrate 100. The device isolation pattern 120 may be formed to define active regions of transistors 320. The device isolation pattern 120 may be formed of or include at least one of insulating materials. The device isolation pattern 120 may be formed by filling a trench, which is formed in the first surface 100*a* of the first semiconductor substrate 100, with an insulating material.

The first circuit layer 300 may be formed on the first surface 100*a* of the first semiconductor substrate 100. The first circuit layer 300 may include the first transistors 320, a first interconnection structure 330, and a first via pad 350, in addition to the first insulating layer 311 and the second insulating layer 312. For example, the first transistors 320 may be formed on the first surface 100*a* of the first semiconductor substrate 100. The first insulating layer 311 may be formed on the first surface 100*a* of the first semiconductor substrate 100 to cover the first transistors 320. The first insulating layer 311 may be formed of or include at least one of silicon oxide, silicon nitride, or silicon oxynitride. In some embodiments, a plurality of the second insulating layers 312 may be provided. For example, the second insulating layers 312 may be stacked on the first insulating layer 311. The first interconnection structure 330 may include a contact plug 331, a metal pattern 332, and a metal via 333. The first interconnection structure 330 may be formed of or include at least one of conductive materials (e.g., copper (Cu) or tungsten (W)). The contact plug 331 may penetrate the first insulating layer 311 and may be coupled to the first transistors 320. The metal pattern 332 may be provided between the first insulating layer 311 and the second insulating layer 312. The metal via 333 may penetrate at least one of the second insulating layers 312 and may be coupled to the metal pattern 332. The first via pad 350 may be provided in one of the second insulating layers 312. The first via pad 350 may be formed of or include at least one of conductive materials (e.g., copper (Cu), aluminum (Al), or tungsten (W)). The connection terminal 390 may be formed on the bottom surface of the first circuit layer 300. A solder pad 391 may be provided between the first circuit layer 300 and the connection terminal 390 and may be coupled to the connection terminal 390. The first transistors 320 may be electrically connected to the connection terminal 390 through the first interconnection structure 330. The first via pad 350 may be electrically connected to the connection terminal 390 through the first interconnection structure 330. A first protection layer 393 may be provided on the bottom surface of the first circuit layer 300. The first protection layer 393 may not cover the connection terminal

390. The first protection layer 393 may be formed of or include at least one of insulating materials (e.g., polymer).

Figure 2B:
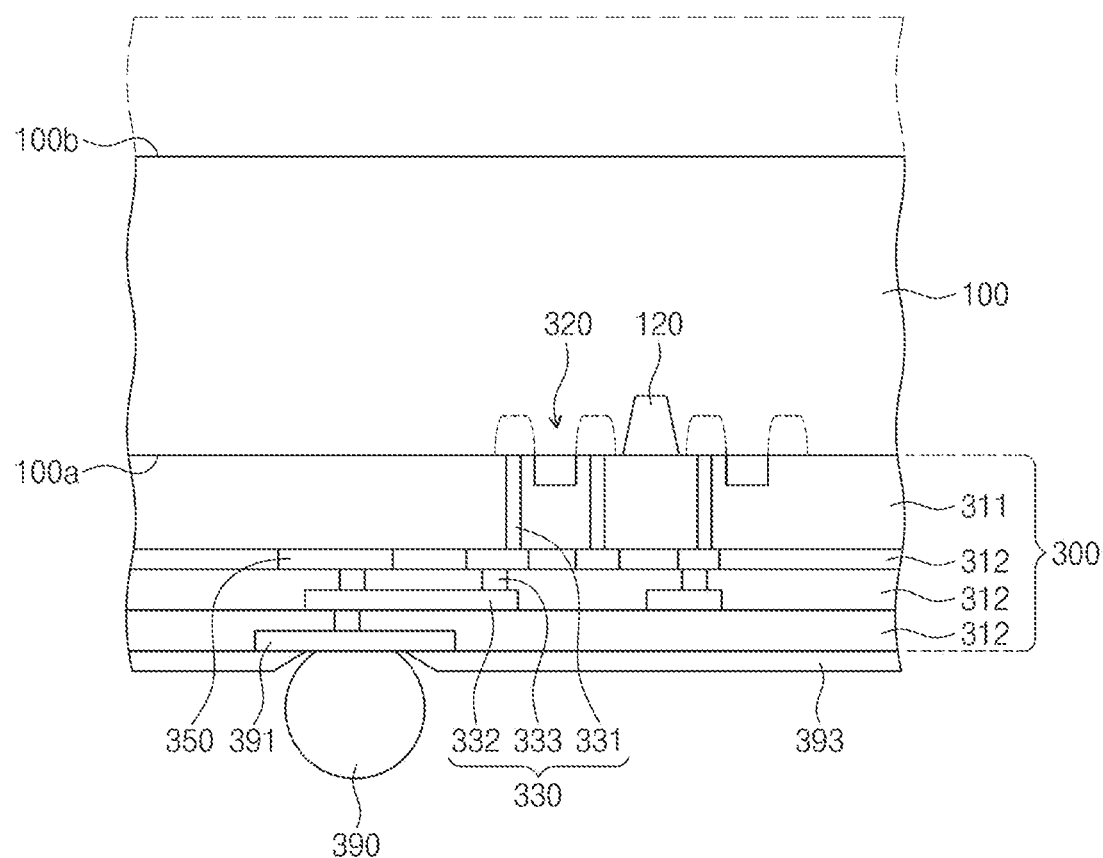

Referring to FIG. 2B, a polishing process or grinding process may be performed on the second surface 100b of the first semiconductor substrate 100 to remove a portion of the first semiconductor substrate 100. The polishing process may be a chemical mechanical polishing (CMP) process. Accordingly, the first semiconductor substrate 100 may be formed to have a decreased thickness.

Referring to FIGS. 2C, 2D, 2E, and 2F, a first penetration hole 150 may be formed in the first semiconductor substrate 100. The first penetration hole 150 may have a first portion 151, a second portion 152, and a third portion 159. The third portion 159 may be formed after the formation of the first portion 151 and the second portion 152 of the first penetration hole 150. The first portion 151 may be an upper portion of the first penetration hole 150, and the second portion 152 and the third portion 159 may be a lower portion of the first penetration hole 150.

Figure 2C:
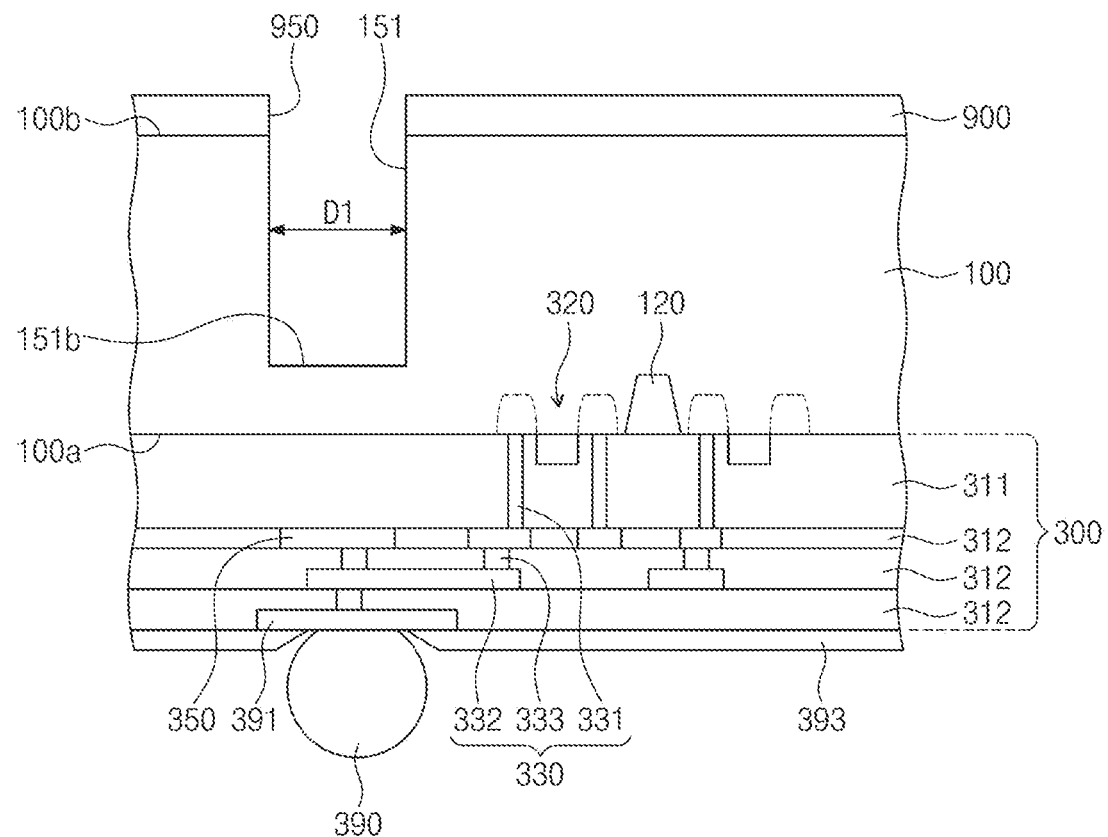

As shown in FIG. 2C, a mask pattern 900 may be formed on the second surface 100b of the first semiconductor substrate 100. The mask pattern 900 may have a first opening 950 exposing the first semiconductor substrate 100. The first semiconductor substrate 100 may be etched using the mask pattern 900. In some embodiments, the etching of the first semiconductor substrate 100 may be performed by a dry etching process using a first gas. The first gas may include a fluorine-containing gas. For example, the first gas may be sulfur hexafluoride ($SF_6$) or carbon fluoride ($C_xF_y$). In a chamber (not shown), reactive ions may be produced from the first gas. During the etching process, an internal pressure of the chamber may range from 100 mTorr to 200 mTorr. The reactive ions may be in a plasma state and may have a positive charge. The reactive ions may pass through the first opening 950 and may collide with the first semiconductor substrate 100. The first semiconductor substrate 100 may be etched due to the collision of the reactive ions, and as a result, the first portion 151 may be formed. A sidewall of the first portion 151 of the first penetration hole 150 may be formed to expose the first semiconductor substrate 100. A bottom surface 151b of the first portion 151 may be positioned in the first semiconductor substrate 100. The bottom surface 151b of the first portion 151 may be positioned at a level higher than the first surface 100a of the first semiconductor substrate 100.

Figure 2D:
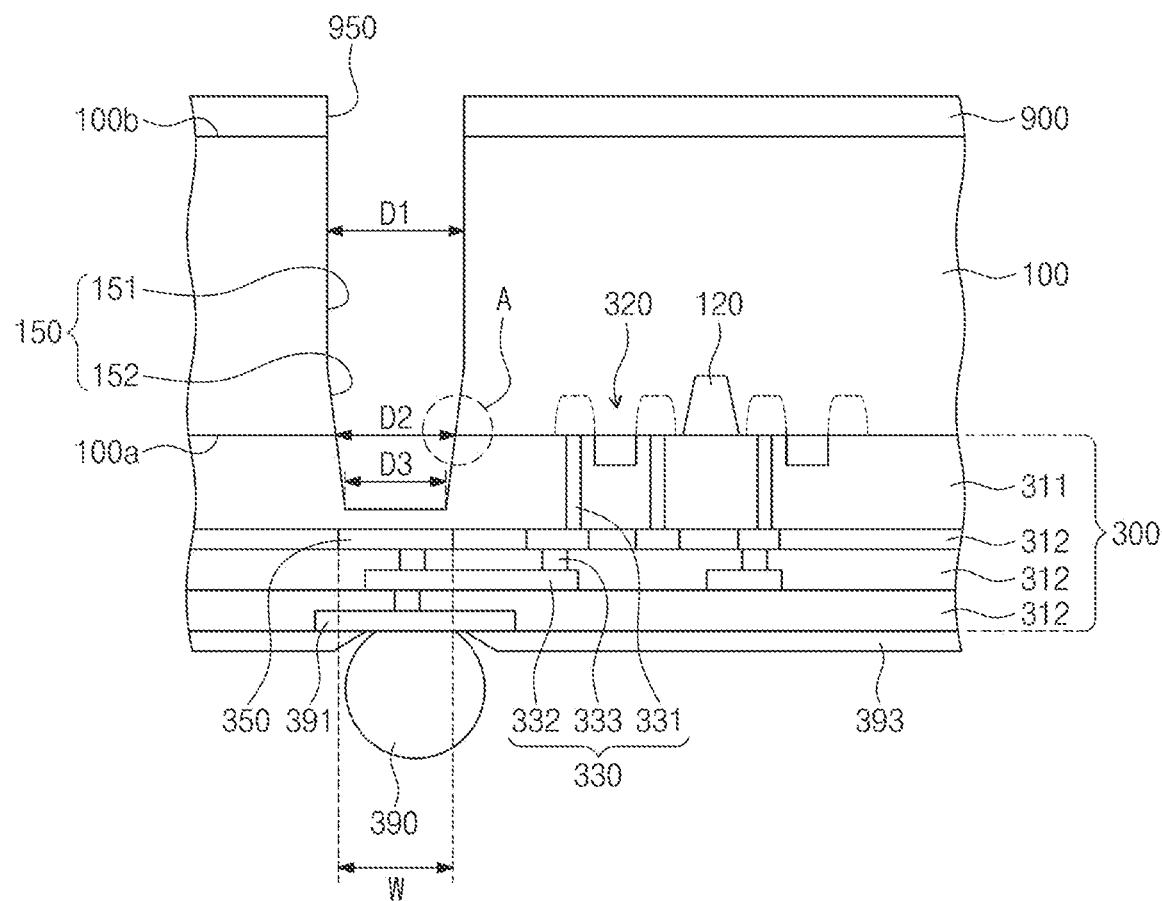

Referring to FIG. 2D, the process conditions in the chamber (not shown) may be changed after the formation of the first portion 151. For example, the etching of the first semiconductor substrate 100 may be performed by a dry etching process using a second gas. The second gas may include a fluorine-containing gas. For example, the second gas may be a mixture gas, in which sulfur hexafluoride ($SF_6$) and carbon fluoride ($C_xF_y$) are mixed. In the chamber (not shown), reactive ions may be produced from the second gas. The internal pressure of the chamber may be lowered, compared with the etching process using the first gas. For example, the internal pressure of the chamber may be higher than 0 mTorr and may be lower than or equal to 100 mTorr. The lower the internal pressure of the chamber, the stronger the collision between the reactive ions and the first semiconductor substrate 100. Thus, the first semiconductor substrate 100 may be etched to have an increased depth. The reactive ions may be in a plasma state and may have a positive charge. The etching process may be performed under the changed process conditions. The reactive ions may pass through the first opening 950 and may collide with the first semiconductor substrate 100. A portion of the first semiconductor substrate 100 and the first insulating layer 311 may be etched due to the collision of the reactive ions, and as a result, the second portion 152 may be formed. The second portion 152 may be connected to the first portion 151 and may be extended into the first insulating layer 311. The second portion 152 of the first penetration hole 150 may be farther from the second surface 100b of the first semiconductor substrate 100 than the first portion 151. A bottom surface 152b of the second portion 152 may be provided at a level higher than a top surface of the first via pad 350. Accordingly, the second portion 152 may not expose the first via pad 350.

If the first penetration hole 150 were to expose the top surface of the first via pad 350, the reactive ions may collide with the first via pad 350 during the etching process. Since the first via pad 350 includes a metallic material, metal particles in the first via pad 350 may be flown toward a side surface of the first penetration hole 150, due to the collision with the reactive ions. In such cases, the metal contamination issue may occur on the side surface of the first penetration hole 150. According to embodiments of the inventive concepts, however, since the first via pad 350 is not exposed through the second portion 152, it may be possible to prevent the reactive ions from colliding with the first via pad 350.

Polymer gas may be introduced into the etching process. The polymer gas may prevent the first insulating layer 311 adjacent to the first via pad 350 from being excessively etched. If the etching process is excessively performed, a recessed region 152d may be formed on a sidewall of the second portion 152, as shown in FIG. 3. The recessed region 152d may be formed adjacent to the first surface 100a of the first semiconductor substrate 100. The polymer gas may prevent the recessed region 152d from being formed, and this may prevent a short circuit from being formed in the semiconductor device 1. In some embodiments, a plurality of the first penetration holes 150 may be formed, as shown in FIG. 1. However, for the sake of simplicity, just one of the penetration holes 150 will be described in more detail below.

In the first semiconductor substrate 100, a width D1 of the first portion 151 of the first penetration hole 150 may be substantially uniform. A width D2 of the second portion 152 of the first penetration hole 150 may be smaller than or equal to the width D1 of the first portion 151. The width D2 of the second portion 152 may be greater than or equal to a width D3 of a bottom surface of the first penetration hole 150. The width D2 of the second portion 152 may not be uniform. For example, the width D2 of the second portion 152 of the first penetration hole 150 in the first semiconductor substrate 100 or the first insulating layer 311 may decrease with decreasing distance from the bottom surface of the first penetration hole 150. The sidewall of the first portion 151 of the first penetration hole 150 may be substantially perpendicular to the second surface 100b of the first semiconductor substrate 100. The sidewall of the second portion 152 of the first penetration hole 150 may have an inclination angle that is different from that of the sidewall of the first portion 151 of the first penetration hole 150. For example, an angle θ of the sidewall of the second portion 152 relative to the first surface 100a of the first semiconductor substrate 100 may be greater than 0° and smaller than 90°. According to some embodiments of the inventive concepts, the width D3 of the bottom surface of the first penetration hole 150 may be further reduced due to the inclination angle of the sidewall of the second portion 152. Accordingly, the first via pad 350 may be formed to have a reduced width W, and this may make it possible to increase a degree of freedom in constructing the first interconnection structure 330. The width W of the first via pad 350 may be greater than the width D3 of the bottom surface of the first penetration hole 150 corresponding thereto. Accordingly, the first penetration hole 150 may be formed to normally expose the first via pad 350, even when there is a process error in the process of forming the first penetration via 158.

Figure 2E:
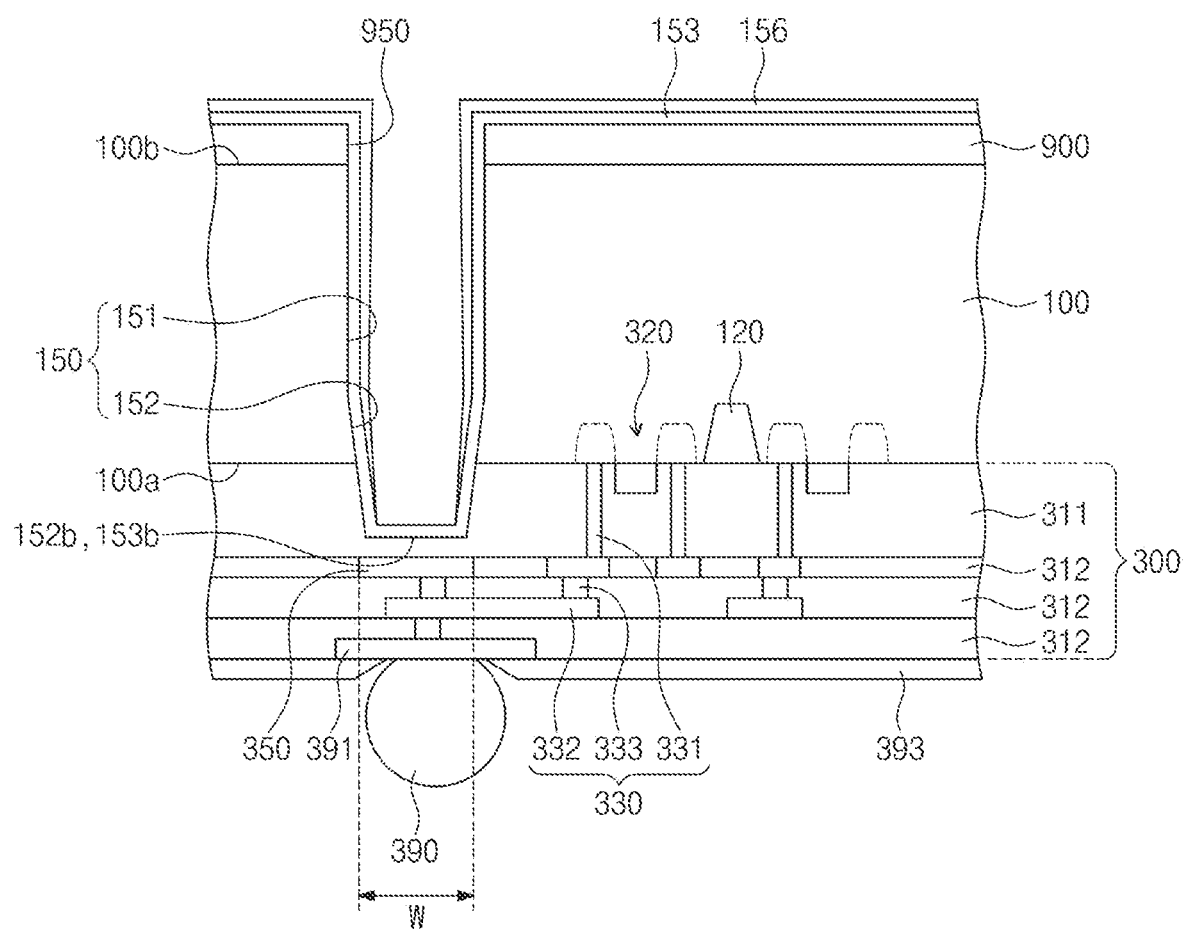

Referring to FIG. 2E, a first liner layer 153 and a first intermediate layer 156 may be formed in the first penetration hole 150. The first liner layer 153 may be formed so as to cover a sidewall of the first penetration hole 150, but may also expose the first via pad 350. The first liner layer 153 may be formed of or include at least one of silicon oxide, silicon nitride, silicon oxynitride, or low-k dielectric materials. The first liner layer 153 may be conformally formed on the sidewall of the first penetration hole 150. The first intermediate layer 156 may be formed on the first liner layer 153. The first intermediate layer 156 may cover the first liner layer 153 but may not cover a lower portion 153b of the first liner layer 153. The lower portion 153b of the first liner layer 153 may be provided on the bottom surface 152b of the second portion 152 of the first penetration hole 150. A thickness of the first intermediate layer 156 may decrease in a direction toward the bottom surface 152b of the second portion 152 of the first penetration hole 150. Accordingly, the first intermediate layer 156 may not be substantially provided on the bottom surface 152b of the second portion 152. The first intermediate layer 156 may be formed of or include silicon nitride (SiN).

Figure 2F:
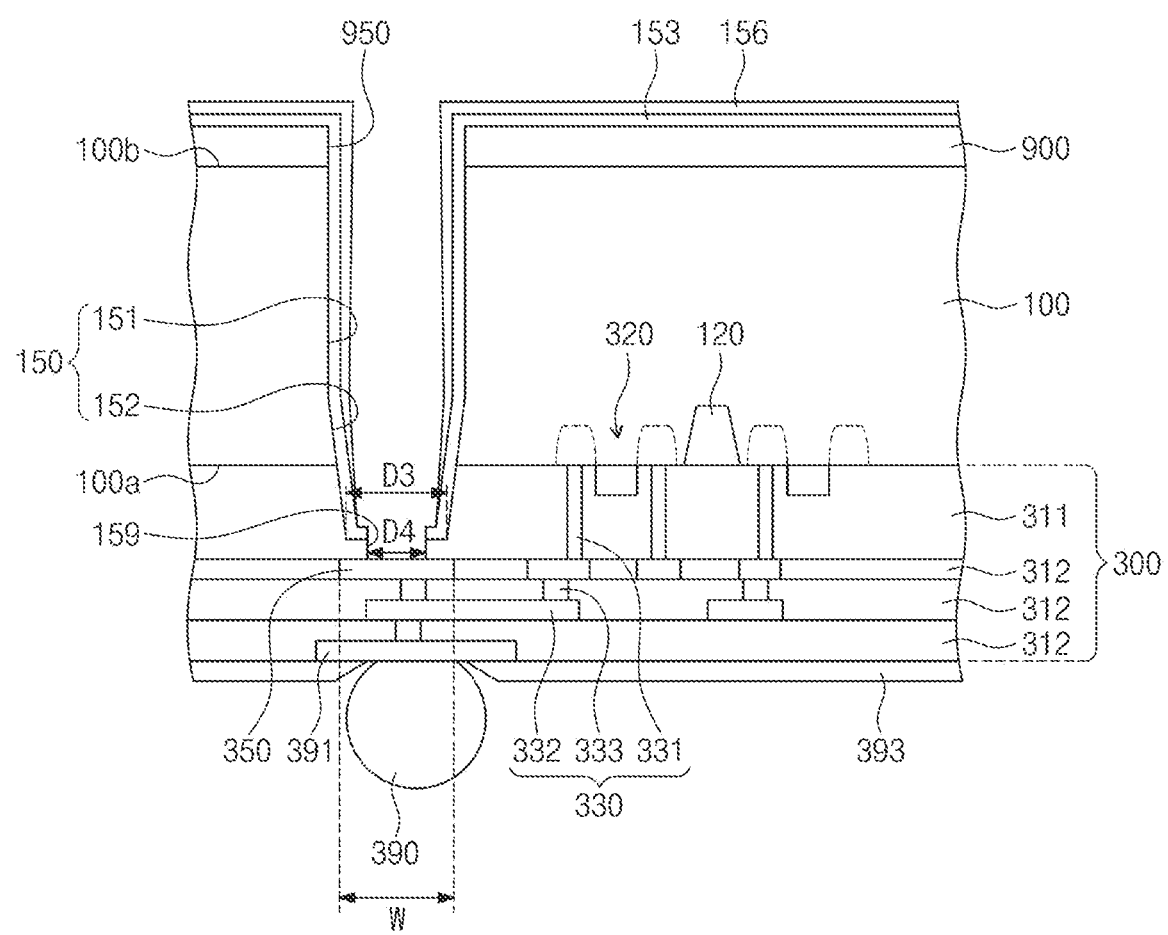

Referring to FIG. 2F, the first liner layer 153 and the first semiconductor substrate 100 may be etched to form the third portion 159 of the first penetration hole 150. The third portion 159 may be formed to expose the first via pad 350. A process of etching the third portion 159 may be substantially the same as a process of etching the second portion 152. A width D4 of the third portion 159 may be smaller than the width D3 of a bottom surface of the second portion 152 and the width W of the first via pad 350.

Figure 2G:
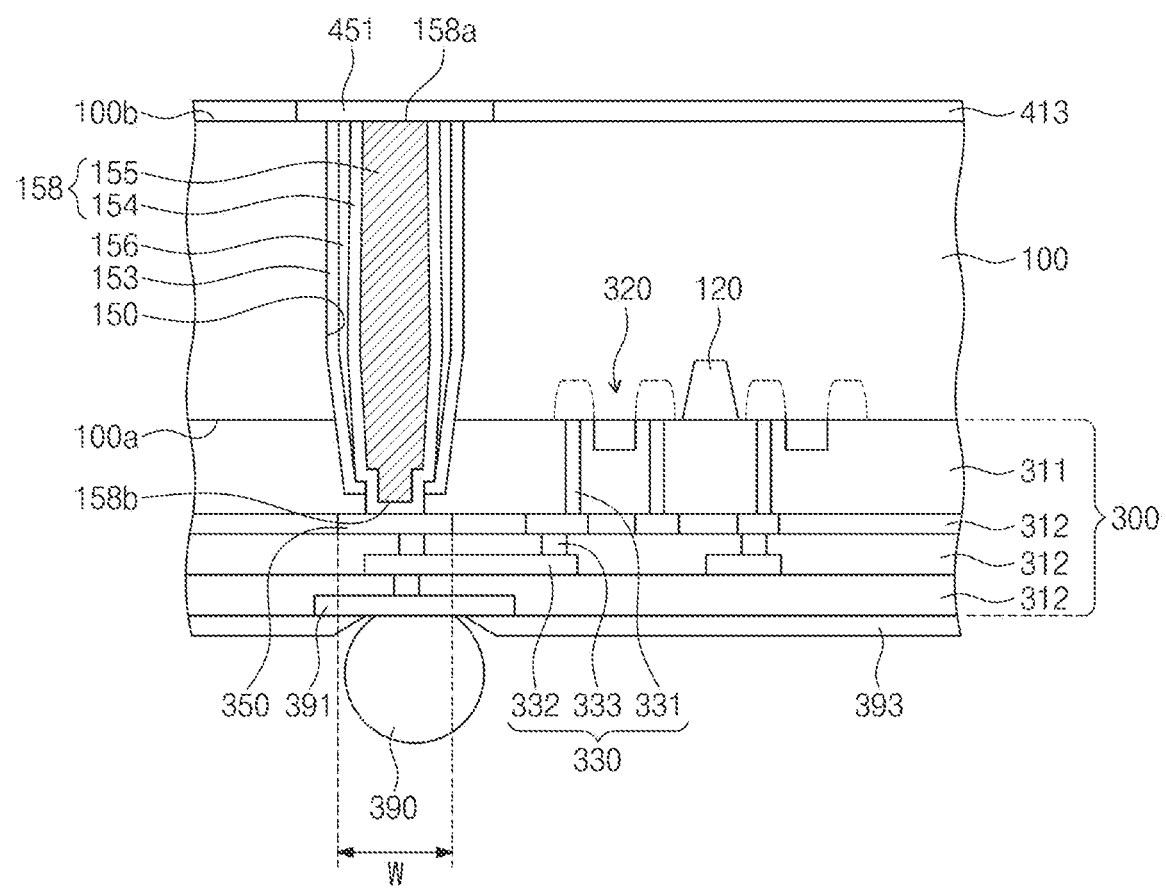

Referring to FIG. 2G, the first penetration via 158 may be formed in the first penetration hole 150. The first penetration via 158 may include a first barrier pattern 154 and a first conductive pattern 155. The first barrier pattern 154 may be formed on the first intermediate layer 156. In detail, the first barrier pattern 154 may cover the first intermediate layer 156 and may conformally cover side and bottom surfaces of the third portion 159. The first barrier pattern 154 may be formed of or include at least one of titanium (Ti), titanium nitride (TiN), tantalum (Ta), tantalum nitride (TaN), or combinations thereof. The first conductive pattern 155 may be formed on the first barrier pattern 154 to fill the first penetration hole 150. For example, the formation of the first barrier pattern 154 may include forming a seed layer (not shown) on the first intermediate layer 156 and performing an electroplating process, in which the seed layer is used as an electrode. As a result of the electroplating process, the first penetration hole 150 may be filled with a conductive material. The first conductive pattern 155 may be formed by planarizing the conductive material. The first conductive pattern 155 may be formed of or include at least one of copper (Cu) or tungsten (W).

A top surface 158a of the first penetration via 158 may be substantially coplanar with the second surface 100b of the first semiconductor substrate 100, and a bottom surface 158b of the first penetration via 158 may be coupled to the first via pad 350. The first penetration via 158 may have a shape corresponding to the first penetration hole 150. For example, a width of the bottom surface 158b of the first penetration via 158 may be smaller than a width of the top surface 158a of the first penetration via 158. It may be possible to prevent the formation of the recessed region 152d described with reference to FIG. 3, and thus, the reliability of the semiconductor device 1 may be improved.

A first intermediate insulating layer 413 and a first connection pad 451 may be formed on the second surface 100b of the first semiconductor substrate 100. The first intermediate insulating layer 413 may be formed of or include substantially the same material as the second insulating layer 312. The first connection pad 451 may be formed on the top surface 158a of the first penetration via 158 and may be electrically connected to the first penetration via 158. The first connection pad 451 may be formed of or include at least one of conductive materials (e.g., metals).

Figure 2H:
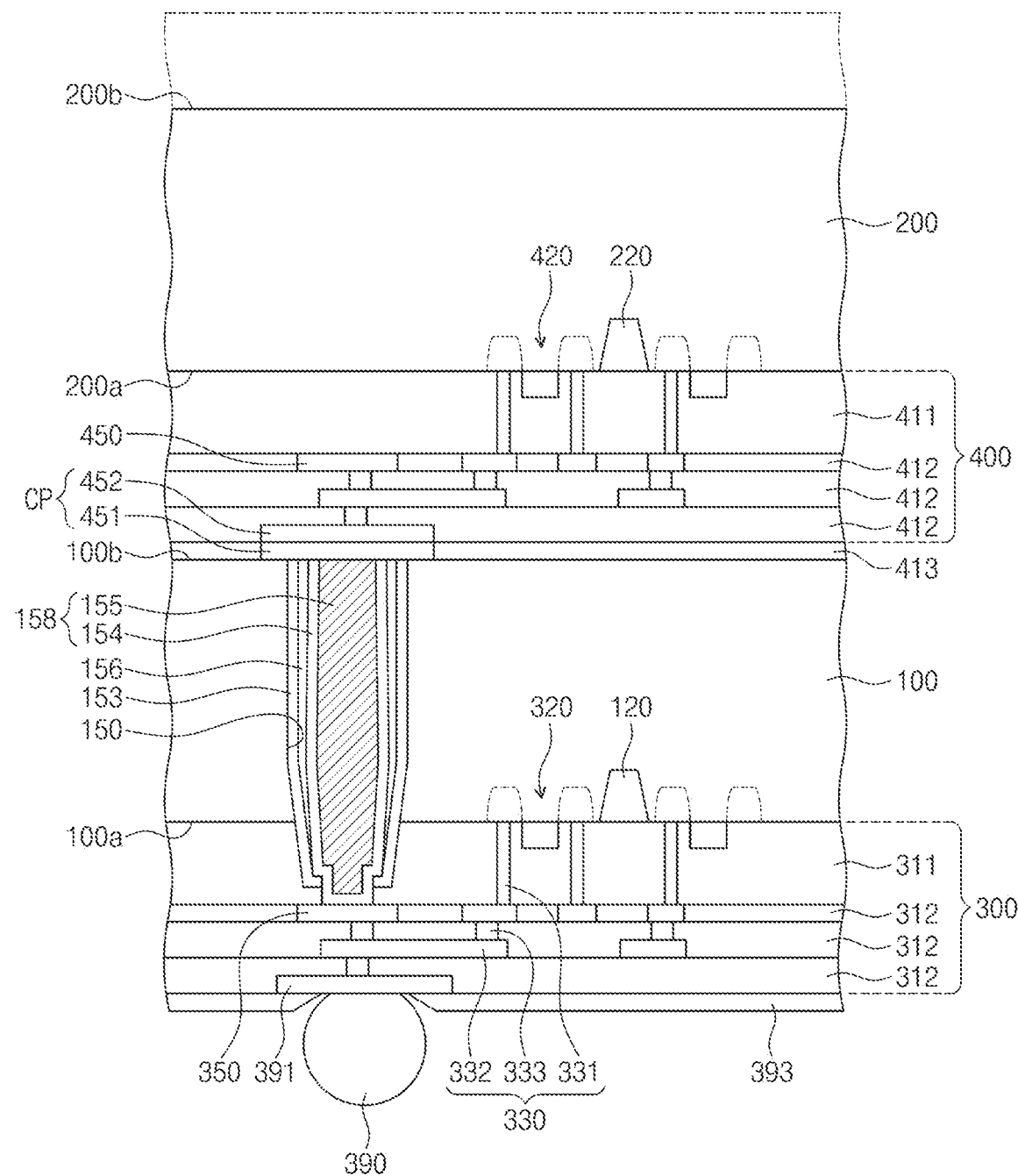

Referring to FIG. 2H, the second semiconductor substrate 200 may be stacked on the first semiconductor substrate 100. In detail, the second semiconductor substrate 200 may be provided on a top surface of the first intermediate insulating layer 413. For example, the second circuit layer 400 may be formed on the first surface 200a of the second semiconductor substrate 200, and then, the second semiconductor substrate 200 may be provided on the first intermediate insulating layer 413 in such a way that the second circuit layer 400 faces the first intermediate insulating layer 413. A second connection pad 452 may be provided in the second circuit layer 400. The first connection pad 451 and the second connection pad 452 may be vertically aligned to each other. Thereafter, a thermal treatment process may be performed to attach the first connection pad 451 and the second connection pad 452 to each other and thereby to form a connection pad CP. Accordingly, the second semiconductor substrate 200 may be fastened to the first semiconductor substrate 100.

The second circuit layer 400 may be provided on the first surface 200a of the second semiconductor substrate 200. The second circuit layer 400 may include second transistors 420 and a second interconnection structure 430, in addition to the third insulating layer 411 and the fourth insulating layer 412. The third insulating layer 411 and the fourth insulating layer 412 may be substantially the same as the first insulating layer 311 and the second insulating layer 312, respectively. The second transistors 420 and the second interconnection structure 430 may be substantially the same as the first transistors 320 and the first interconnection structure 330 described with respect to FIG. 2A. The connection pad CP may include the first connection pad 451 and the second connection pad 452. The connection pad CP may be provided on a top surface of the first semiconductor substrate 100. In detail, the connection pad CP may be provided on the top surface 158a of the first penetration via 158 and may be electrically connected to the first penetration via 158. The connection pad CP may be formed of or include at least one of conductive materials (e.g., metals). A polishing or grinding process may be performed on the second surface 200b of the second semiconductor substrate 200 to remove a portion of the second semiconductor substrate 200. The polishing process may be a chemical mechanical polishing (CMP) process. Accordingly, the second semiconductor substrate 200 may be provided to have a small thickness.

Figure 2I:
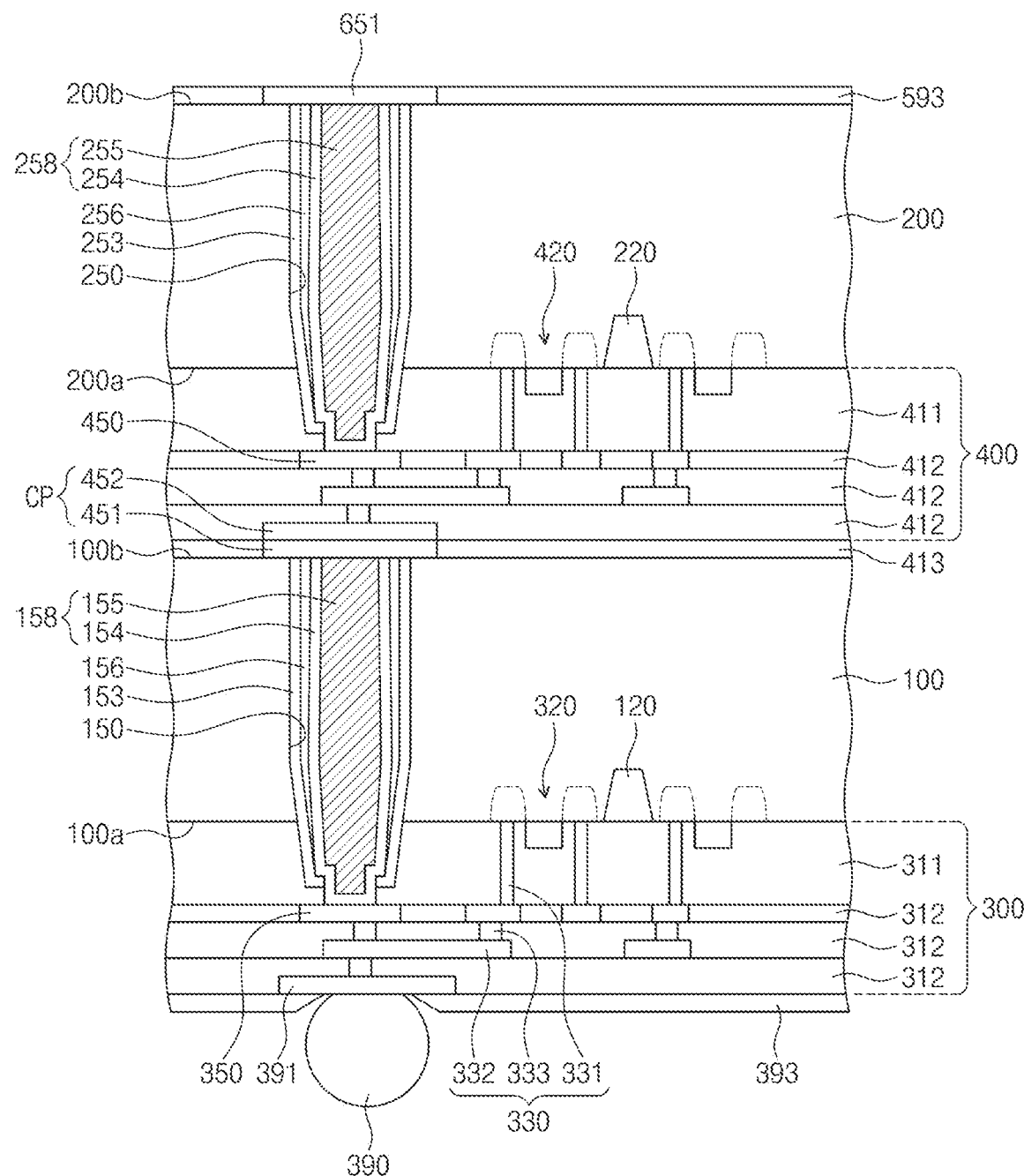

Referring to FIG. 2I, the second penetration via 258 may be formed in the second semiconductor substrate 200. The formation of the second penetration via 258 may be performed by the same method as that for the first penetration via 158 described with respect to FIGS. 2C to 2G. For example, a mask pattern (not shown) may be formed on the second surface 200b of the second semiconductor substrate 200. The second semiconductor substrate 200, which is exposed by the mask pattern, and the third insulating layer 411 may be sequentially etched to form a first portion 251 and a second portion 252 of a second penetration hole 250. A second liner layer 253 and a second intermediate layer 256 may be formed in the first portion 251 and the second portion 252 of the second penetration hole 250. The second liner layer 253 and the second semiconductor substrate 200 may be etched to form a third portion 259. The second penetration via 258 may be formed in the second penetration hole 250. The second liner layer 253 and the second penetration via 258 may be formed by the method previously described with reference to FIG. 2G. The second penetration via 258 may include a second barrier pattern 254 and a second conductive pattern 255. For example, the second barrier pattern 254 may be formed on the second intermediate layer 256. The second conductive pattern 255 may be formed to fill the second penetration hole 250, in which the second barrier pattern 254 is formed.

A second protection layer 593 and a third connection pad 651 may be formed on the second surface 200b of the second semiconductor substrate 200. The second protection layer 593 may be formed of or include at least one of insulating materials (e.g., polymer). The third connection pad 651 may be formed on the second penetration via 258 and may be electrically connected to the second penetration via 258. The third connection pad 651 may be formed of or include at least one of metallic materials. The semiconductor device 1 may be fabricated through the fabrication method described above.

Hereinafter, a method of forming the second semiconductor substrate 200, the second penetration via 258, and a third penetration via 258' will be described in more detail below.

FIGS. 4A to 4E are enlarged sectional views of a portion 'II' of FIG. 1 illustrating a method of fabricating a semiconductor device, according to some embodiments of the inventive concepts. For concise description, previously described elements may be identified with the same reference numbers without repeating an overlapping description thereof.

Figure 4A:
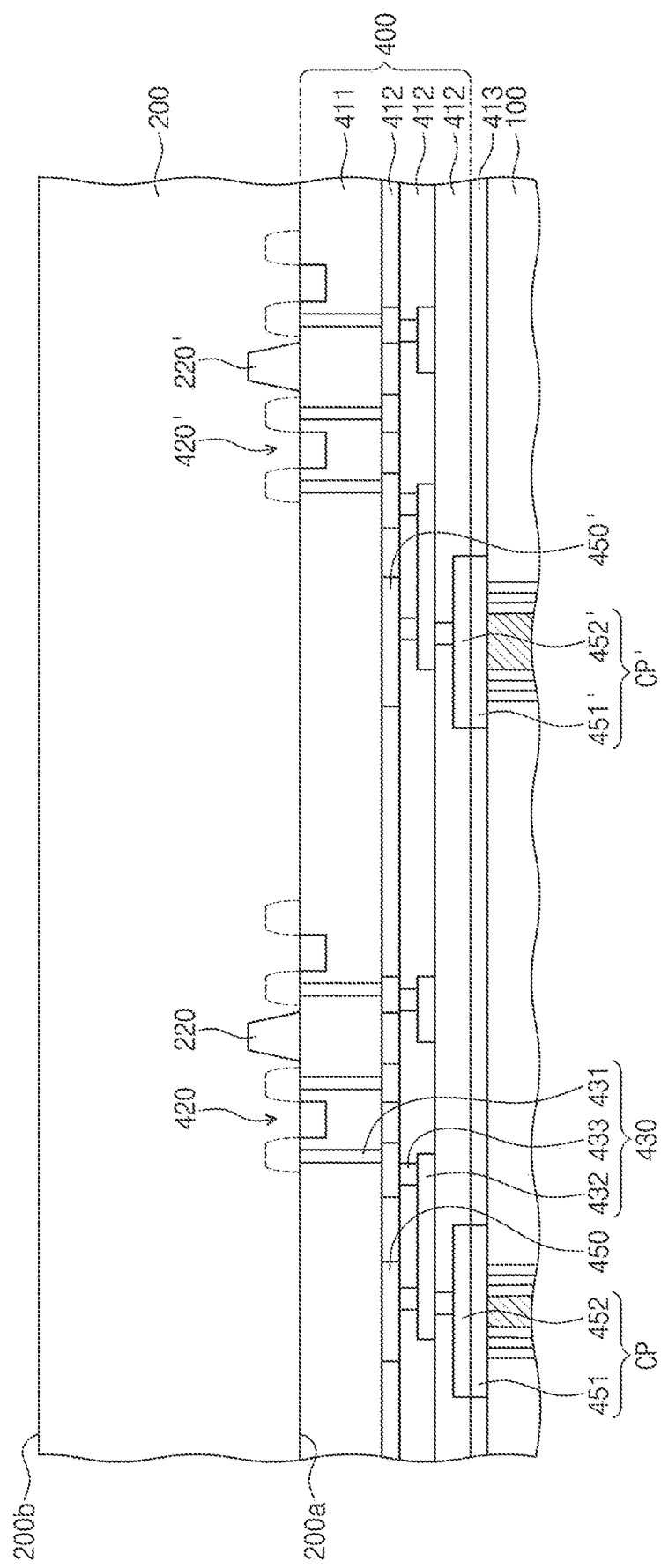
FIGS. 4A to 4E are enlarged sectional views of a portion 'II' of FIG. 1 illustrating a method of fabricating a semiconductor device, according to some embodiments of the inventive concepts.
Figure 4B:
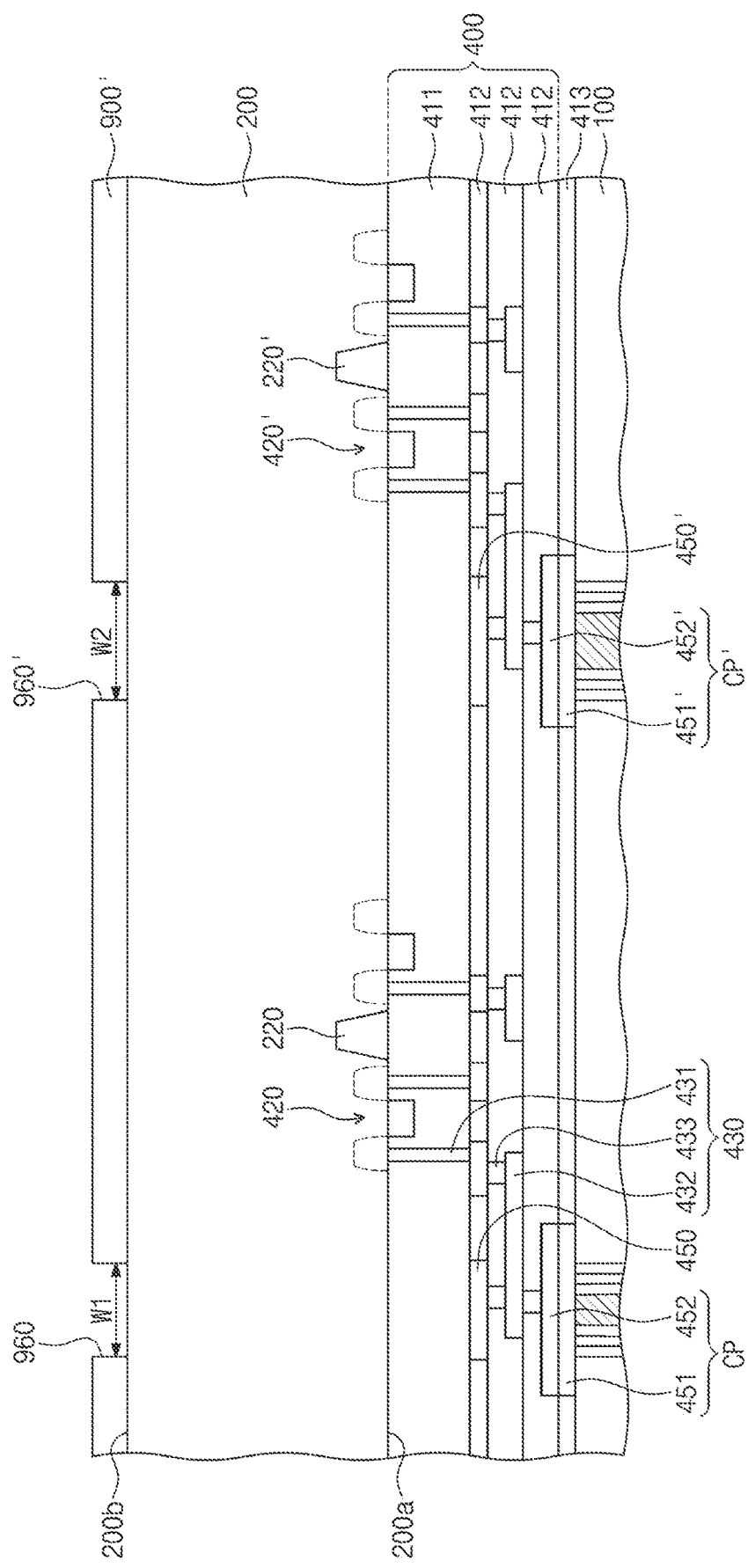

Referring to FIGS. 4A and 4B, a mask pattern 900' may be formed on the second surface 200b of the second semiconductor substrate 200. The mask pattern 900' may have a second opening 960 and a third opening 960', which are formed to expose the second semiconductor substrate 200. A width W1 of the second opening 960 and a width W2 of the third opening 960' may differ from each other. For example, the width W1 of the second opening 960 may be smaller than the width of the second opening 960'.

Figure 4C:
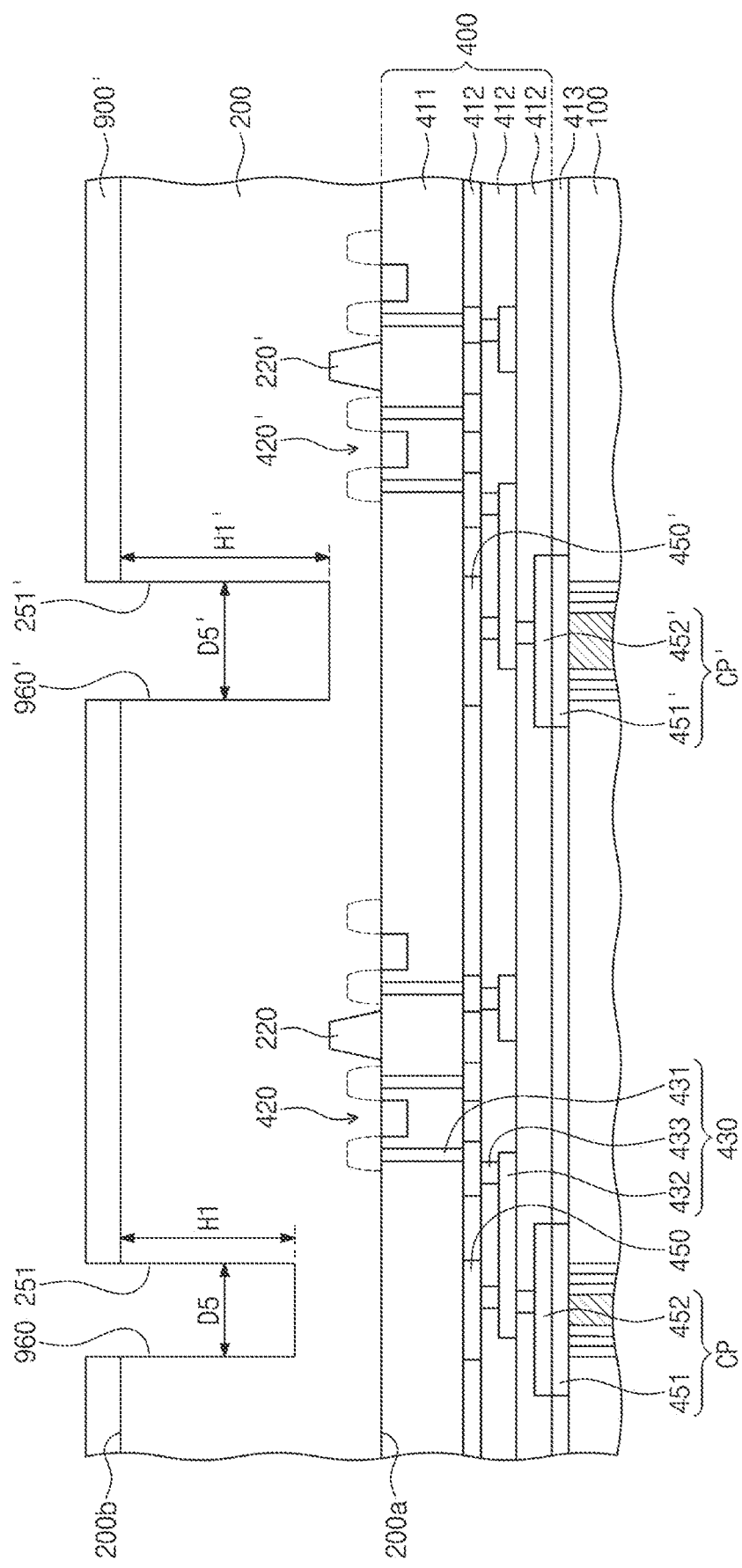
Figure 4D:
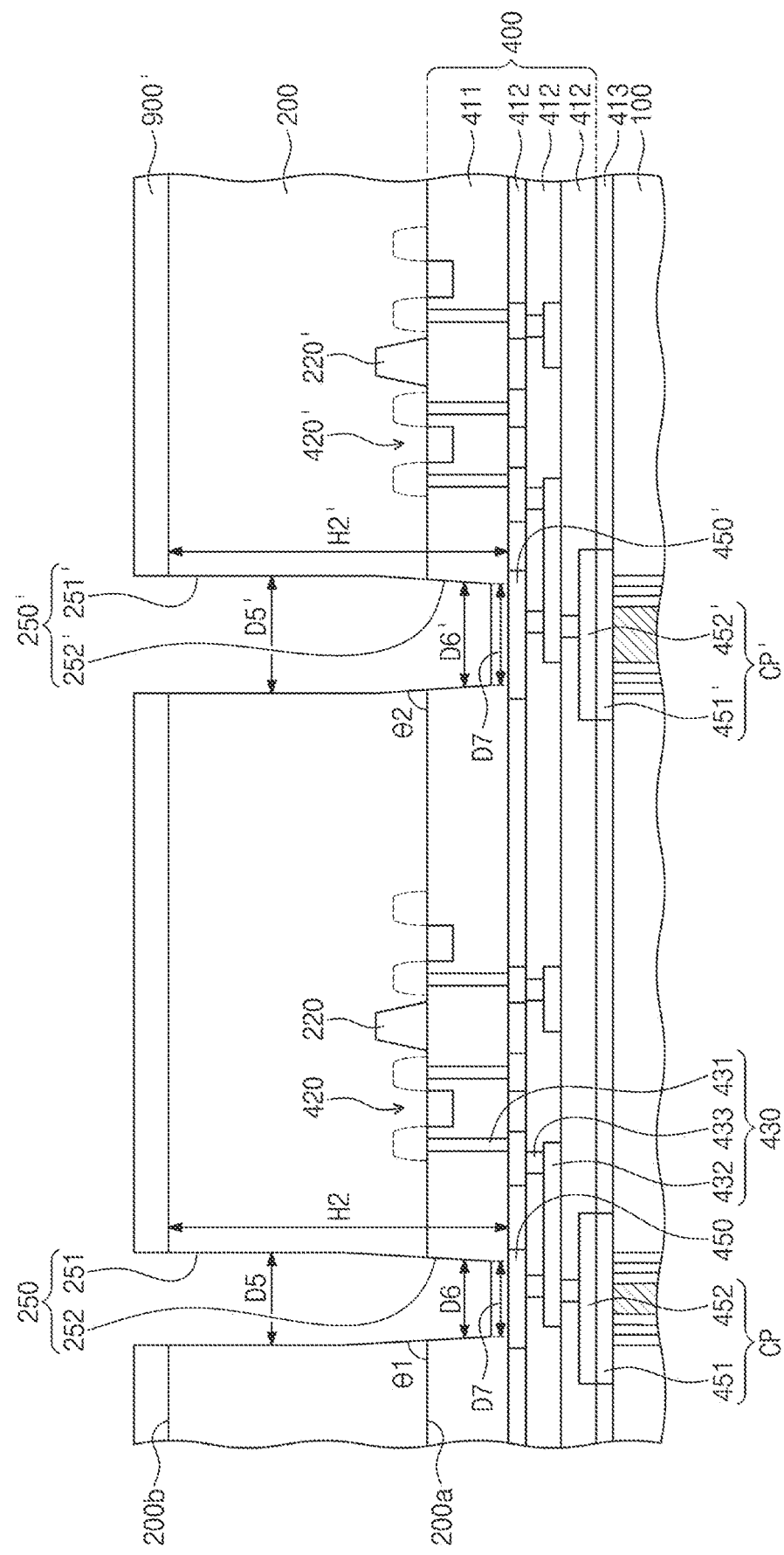
Figure 4E:
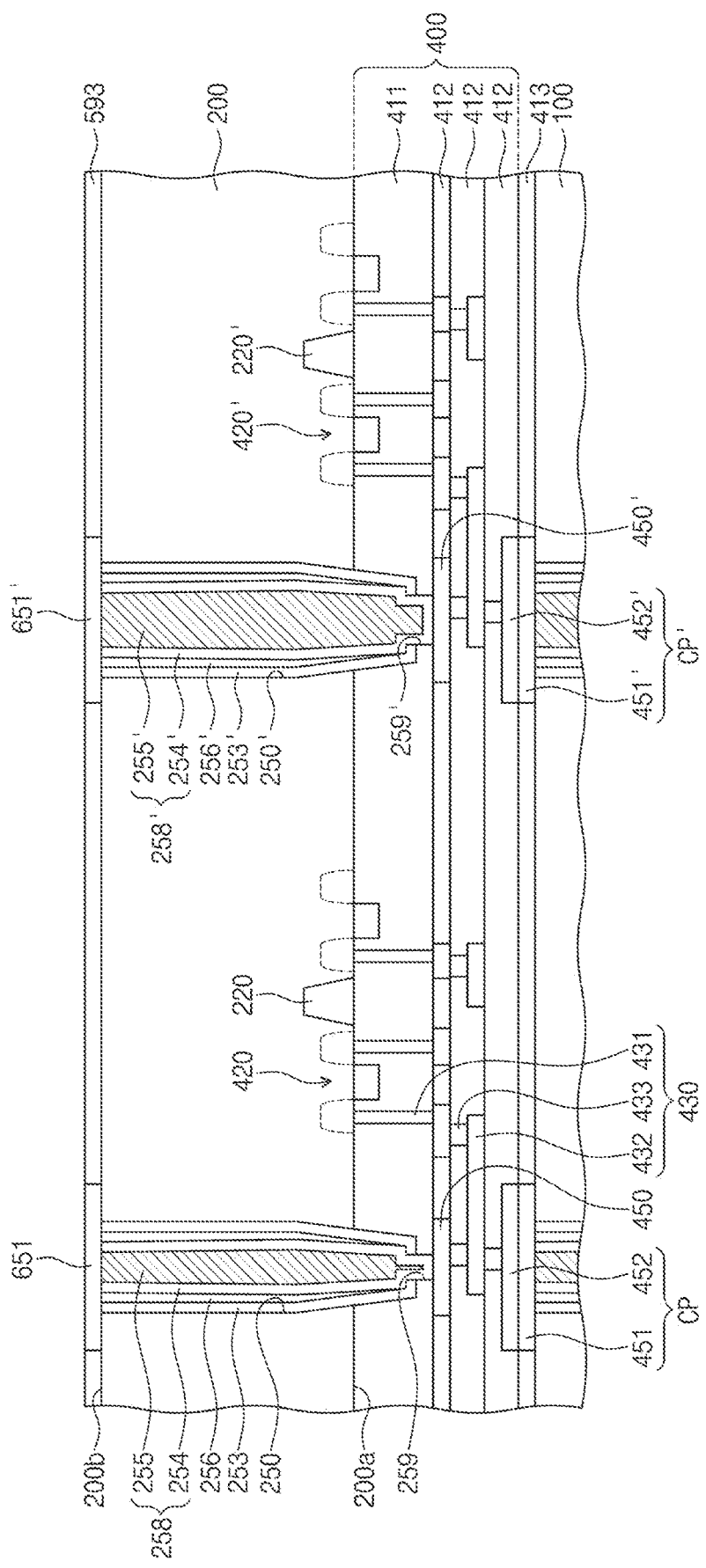

Referring to FIGS. 4C, 4D, and 4E, the second penetration hole 250 and a third penetration hole 250' may be formed in the second semiconductor substrate 200 by an etching process using the mask pattern 900'. For example, portions of the second semiconductor substrate 200, which are exposed by the second opening 960 and the third opening 960' of the mask pattern 900', may be etched by reactive ions. The etching process may be substantially the same as that described with reference to FIGS. 2C, 2D, and 2F. The second penetration hole 250 may include the first portion 251, the second portion 252, and the third portion 259. A width D5 of the first portion 251 of the second penetration hole 250 may be substantially uniform. The width D5 of the first portion 251 of the second penetration hole 250 may be substantially equal to the width W1 of the second opening 960. A width D6 of the second portion 252 of the second penetration hole 250 may be smaller than the width D5 of the first portion 251. A width of the second portion 252 may not be uniform. For example, the width D6 of the second portion 252 may decrease with decreasing distance from a bottom surface of the second penetration hole 250. A width of the third portion 259 of the second penetration hole 250 may be smaller than the width D6 of the second portion 252 of the second penetration hole 250. The third penetration hole 250' may have a first portion 251', a second portion 252', and a third portion 259'. A width D5' of the first portion 251' of the third penetration hole 250' may be substantially uniform. The width D5' of the first portion 251' of the third penetration hole 250' may be substantially equal to the width W2 of the third opening 960'. A width D6' of the second portion 252' of the third penetration hole 250' may be smaller than the width D5' of the first portion 251'. The width D6' of the second portion 252' may not be uniform. For example, the width D6' of the second portion 252' may decrease with decreasing distance from a bottom surface of the third penetration hole 250'. A width of the third portion 259' of the third penetration hole 250' may be smaller than the width D6' of the second portion 252' of the third penetration hole 250'. The width D5 of the first portion 251 of the second penetration hole 250 may be smaller than the width D5' of the first portion 251' of the third penetration hole 250'. A height H2 of the second penetration hole 250 may be substantially equal to a height H2' of the third penetration hole 250'. However, a height H1 of the first portion 251 of the second penetration hole 250 may be smaller than a height H1' of the first portion 251' of the third penetration hole 250'.

Sidewalls of the first portion 251 of the second penetration hole 250 may be substantially perpendicular to the second surface 200b of the second semiconductor substrate 200. Sidewalls of the second portion 252 of the second penetration hole 250 may differ from the sidewall of the first portion 251 in terms of an inclination angle relative to the second surface 200b of the second semiconductor substrate 200. For example, each of angles θ1 of the sidewalls of the second portion 252 relative to the first surface 200a of the second semiconductor substrate 200 may be greater than 0° and smaller than 90°. According to some embodiments of the inventive concepts, due to the inclination angle of the sidewall of the second portion 252, the width D6 of the bottom surface of the second penetration hole 250 may be reduced, compared to when the sidewalls of the first and second portions 251 and 252 have the same inclination angle. Accordingly, a second via pad 450 may be formed to have a reduced width, and this may make it possible to increase a degree of freedom in constructing the second interconnection structure 430.

Sidewalls of the first portion 251' of the third penetration hole 250' may be substantially perpendicular to the second surface 200b of the second semiconductor substrate 200. Sidewalls of the second portion 252' of the third penetration hole 250' may differ from the sidewall of the first portion 251' in terms of an inclination angle relative to the second surface 200b of the second semiconductor substrate 200. For example, each of angles θ2 of the sidewalls of the second portion 252' relative to the first surface 200a of the second semiconductor substrate 200 may be greater than 0° and smaller than 90°. According to an embodiment of the inventive concept, due to the inclination angle of the sidewall of the second portion 252', the width D6' of the bottom surface of the third penetration hole 250' may be reduced, compared to the case in which the sidewalls of the first and second portions 251' and 252' have the same inclination angle. Accordingly, a third via pad 450' may be formed to have a reduced width, and this may make it possible to increase a degree of freedom in constructing the second interconnection structure 430. The sidewalls of the second portion of the second penetration hole may differ from the sidewalls of the second portion of the third penetration hole in terms of the inclination angle relative to the second surface 200b of the second semiconductor substrate 200.

Referring to FIG. 4E, a third penetration via 258' may be formed, in addition to the second penetration via 258 described with respect to FIG. 2I. The formation of the third penetration via 258' may be substantially the same as the formation of the second penetration via 258 described with respect to FIG. 2I. Accordingly, the penetration vias 258 and 258' with different widths may be formed.

The penetration vias 258 and 258' may have different functions, depending on sizes of the first portions 251 and 251' of the penetration holes 250 and 250' corresponding thereto. For example, due to its large width, the third penetration via 258' may have a small electric resistance. Accordingly, the third penetration via 258' may serve as a power via for supplying the current from an external power source to the semiconductor device 1 without a substantial loss. Due to its small width, the second penetration via 258 may suppress the occurrence of parasitic capacitance. Accordingly, an electrical signal may be input to the semiconductor device 1 through the second penetration via 258. This may make it possible to reduce the distortion of electrical signals. The second protection layer 593 may be formed on the second surface 200b of the second semiconductor substrate 200. The third connection pad 651 may be formed on a top surface of the second penetration via 258. A fourth connection pad 651' may be formed on a top surface of the third penetration via 258'. The semiconductor device 1 may be fabricated through the fabrication method described above.

FIG. 5 is a sectional view illustrating a semiconductor device, according to some embodiments of the inventive concepts. For concise description, previously described elements may be identified by the same reference numbers without repeating an overlapping description thereof.

Referring to FIG. 5, a semiconductor device 2 may include a first semiconductor substrate 1000, a second semiconductor substrate 2000, a third semiconductor substrate 3000, a fourth semiconductor substrate 4000, a first circuit layer 1300, a second circuit layer 2300, a third circuit layer 3300, a fourth circuit layer 4300, a first penetration via 1155, a second penetration via 2155, a third penetration via 3155, and a fourth penetration via 4155. Each of the first to fourth semiconductor substrates 1000, 2000, 3000, and 4000 may be configured to have substantially the same features as the first semiconductor substrate 100 described with respect to FIG. 1. Each of the first to fourth circuit layers 1300, 2300, 3300, and 4300 may be configured to have substantially the same features as the first or second circuit layer 300 or 400 described with respect to FIGS. 2A to 2H. Each of the first to fourth penetration vias 1155, 2155, 3155, and 4155 may be configured to have substantially the same features as the first, second, or third penetration via 158, 258, or 358 described with reference to FIGS. 2C to 2H and FIGS. 3C to 3D.

According to some embodiments of the inventive concepts, it may be possible to form penetration vias, whose widths are different from each other, in a semiconductor substrate through an etching process using a single mask pattern Previously, a mask for an etching process would be changed depending on a width of a penetration via, and the fabrication process would suffer from an increase in the number of process steps and a reduction in efficiency of the fabrication process. By contrast, in the example embodiments of the present disclosure a single mask pattern is used to simultaneously form penetration vias with different widths, it may be possible to reduce the number of process steps and thereby to increase the efficiency of the fabrication process.

According to some embodiments of the inventive concepts, since the penetration vias are provided to have at least two different widths, it may be possible to more efficiently design the disposition of the penetration vias when the semiconductor device is designed, and a thickness and size of the semiconductor device may be reduced as a result.

While some example embodiments of the inventive concepts have been particularly shown and described, it will be understood by one of ordinary skill in the art that variations in form and detail may be made therein without departing from the scope of the attached claims.

What is claimed is:

1. A semiconductor device, comprising:
   a first semiconductor substrate having a first surface and a second surface opposite from each other;
   a second semiconductor substrate having a first surface and a second surface opposite from each other;
   a first circuit layer provided on the first surface of the first semiconductor substrate;
   a second circuit layer provided on the first surface of the second semiconductor substrate;
   a connection pad interposed between the second circuit layer and the first semiconductor substrate;
   a first penetration via and a second penetration via that extend from the second surface of the first semiconductor substrate into at least a portion of the first circuit layer, the first penetration via in a first penetration hole and the second penetration via in a second penetration hole; and
   a third penetration via that extends from the second surface of the second semiconductor substrate into at least a portion of the second circuit layer,
   wherein a maximum width of the first penetration via is greater than a maximum width of the second penetration via,
   wherein each of the first and second penetration holes comprises a first portion, a second portion, and a third portion,
   wherein the first portions of the first and second penetration holes are adjacent to the second surface of the first semiconductor substrate and the second portions of the first and second penetration holes are between the first portions and the third portions of the respective first and second penetration holes, wherein a height of the first portion of the first penetration hole is greater than a height of the second portion of the first penetration hole,
   wherein the first penetration hole has therein a first intermediate layer that surrounds the first penetration via, wherein a thickness of the first intermediate layer is a first thickness between a top of the first portion of the first penetration hole and a bottom of the first portion of the first penetration hole, wherein the thickness of the first intermediate layer decreases from the first thickness to a second thickness that is less than the first thickness between a top of the second portion of the first penetration hole and a bottom of the second portion of the first penetration hole, and
   wherein a height of the first portion of the first penetration hole is greater than a height of the first portion of the second penetration hole.

2. The device of claim 1, wherein the connection pad comprises a first connection pad and a second connection pad, and
    wherein the first connection pad is provided on top surfaces of the first penetration via and the second penetration via.

3. The device of claim 2, further comprising a first intermediate insulating layer on the second surface of the first semiconductor substrate, and
    wherein a top surface of the first connection pad is coplanar with a top surface of the first intermediate insulating layer.

4. The device of claim 2, wherein the second circuit layer comprises a second interconnection structure therein,
    wherein the second interconnection structure is connected to the second connection pad, and
    wherein the first connection pad and the second connection pad are directly coupled to each other to electrically connect the first penetration via to the third penetration via.

5. The device of claim 1, wherein a maximum width of the third penetration via is greater than the maximum width of the second penetration via.

6. The device of claim 5, further comprising:
a third connection pad provided on a top surface of the third penetration via; and
a protection layer provided on a top surface of the second semiconductor substrate,
wherein the protection layer comprises an insulating material.

7. The device of claim 5, further comprising:
a third semiconductor substrate provided on a top surface of the second semiconductor substrate;
a third circuit layer provided on a bottom surface of the third semiconductor substrate; and
a fourth penetration via penetrating the third semiconductor substrate and at least a portion of the third circuit layer.

8. The device of claim 1, wherein the third penetration via is provided in a third penetration hole,
    wherein the third penetration hole comprises a first portion, a second portion, and a third portion,
    wherein a sidewall of the first portion of the third penetration hole is substantially perpendicular to the second surface of the second semiconductor substrate, and
    wherein a sidewall of the second portion of the third penetration hole has a different inclination angle from the sidewall of the first portion of the third penetration hole.

9. A semiconductor device, comprising:
a first semiconductor substrate;
a first circuit layer provided on a bottom surface of the first semiconductor substrate;
a second semiconductor substrate provided on a top surface of the first semiconductor substrate;
a second circuit layer interposed between the second semiconductor substrate and the first semiconductor substrate;
first and second lower penetration vias that penetrate the first semiconductor substrate and at least a portion of the first circuit layer;
first and second upper penetration vias that penetrate the second semiconductor substrate and at least a portion of the second circuit layer; and
first connection pads provided on top surfaces of the first and second lower penetration vias,
wherein the first and second lower penetration vias are electrically connected to the first connection pads, respectively,
wherein the second circuit layer comprises second connection pads therein,
wherein the first and second upper penetration vias are electrically connected to the second connection pads, respectively,
wherein the first connection pads are directly coupled to the second connection pads, respectively,
wherein the first and second lower penetration vias have different widths and are provided respectively in a first penetration hole and a second penetration hole,
wherein the first and second upper penetration vias have different widths and are provided respectively in a third penetration hole and a fourth penetration hole,
wherein each of the first and second penetration holes has a first portion, a second portion, and a third portion,
wherein the first portions of the first and second penetration holes are adjacent to the bottom surface of the first semiconductor substrate,
wherein a width of the first portion of the first penetration hole is greater than a width of the first portion of the second penetration hole,
wherein a height of the first portion of the first penetration hole is smaller than a height of the first portion of the second penetration hole,
wherein the first penetration hole has a first intermediate layer therein that surrounds the first lower penetration via,
wherein the second portion of the first penetration hole comprises a bottom surface between a sidewall of the second portion of the first penetration hole and a sidewall of the third portion of the first penetration hole, and
wherein a thickness of the first intermediate layer decreases toward the bottom surface of the second portion of the first penetration hole.

10. The device of claim 9,
wherein sidewalls of the first portions of the first and second penetration holes are substantially perpendicular to the bottom surface of the first semiconductor substrate, and
wherein sidewalls of the second portions of the first and second penetration holes differ from the sidewalls of the first portions of the first and second penetration holes in terms of an inclination angle relative to the bottom surface of the first semiconductor substrate.

11. The device of claim 10, wherein an angle between the sidewall of the second portion of the first penetration hole and the bottom surface of the first semiconductor substrate is greater than 0° and smaller than 90°.

12. The device of claim 10, wherein a width of the second portion of the first penetration hole decreases with decreasing distance from a bottom surface of the first penetration hole.

13. The device of claim 10, wherein a width of the second portion of the first penetration hole is less than or equal to a width of the first portion of the first penetration hole.

14. The device of claim 9, wherein the first circuit layer comprises a first via pad therein and the second circuit layer comprises a second via pad therein,
    wherein the first lower penetration via is coupled to the first via pad, and
    wherein the first upper penetration via is coupled to the second via pad.

15. The device of claim 14, wherein each of the first and third penetration holes has a third portion,
wherein a width of the first via pad is larger than a width of the third portion of the first penetration hole, and
wherein a width of the second via pad is larger than a width of the third portion of the third penetration hole.

16. The device of claim 9, wherein the first lower penetration via comprises a barrier layer on the bottom surface of the first penetration hole.

17. A semiconductor device, comprising:
a first semiconductor substrate having a first surface and a second surface opposite from each other;
a second semiconductor substrate having a first surface and a second surface opposite from each other;
a first circuit layer provided on the first surface of the first semiconductor substrate;
a second circuit layer provided on the first surface of the second semiconductor substrate;
a connection pad interposed between the second circuit layer and the first semiconductor substrate;
a first intermediate insulating layer on the second surface of the first semiconductor substrate;
a first penetration via and a second penetration via extending from the second surface of the first semiconductor substrate into at least a portion of the first circuit layer; and
a third penetration via extending from the second surface of the second semiconductor substrate into at least a portion of the second circuit layer,
wherein a maximum width of the first penetration via is greater than a maximum width of the second penetration via,
wherein the connection pad comprises a first connection pad and a second connection pad,
wherein a top surface of the first connection pad is coplanar with a top surface of the first intermediate insulating layer,
wherein the first penetration via is in a first penetration hole and surrounded in the first penetration hole by a first intermediate layer that has a thickness that is constant along a first portion of the first penetration hole and decreases along a second portion of the first penetration hole as a distance from the second surface of the first semiconductor substrate increases,
wherein the first portion of the first penetration hole is between the second surface of the first semiconductor substrate and the second portion of the first penetration hole, and
wherein a height of the first portion of the first penetration hole is greater than a height of the second portion of the first penetration hole.

18. The semiconductor device of claim 17, wherein the first circuit layer comprises a first via pad and a second via pad therein,
wherein the first penetration via is coupled to the first via pad, and
wherein the second penetration via is coupled to the second via pad.

19. The semiconductor device of claim 18,
wherein the second penetration via has a first portion, a second portion, and a third portion, wherein the first penetration via has a third portion, the first portion of each of the first and second penetration vias adjacent to the second surface of the first semiconductor substrate, the third portion of each of the first and second penetration vias within the first circuit layer, and the second portion of each of the first and second penetration vias between the first and third portions of the respective penetration via,
wherein a width of the first via pad is larger than a width of the third portion of the first penetration via, and
wherein a width of the second via pad is larger than a width of the third portion of the second penetration via.

* * * * *